(12) United States Patent
Kawada

(10) Patent No.: US 10,816,333 B2
(45) Date of Patent: Oct. 27, 2020

(54) PATTERN MEASUREMENT METHOD AND PATTERN MEASUREMENT DEVICE

(71) Applicant: Hitachi High-Tech Corporation, Minato-ku, Tokyo (JP)

(72) Inventor: Hiroki Kawada, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 0 days.

(21) Appl. No.: 16/313,365

(22) PCT Filed: Jul. 28, 2016

(86) PCT No.: PCT/JP2016/072104
§ 371 (c)(1),
(2) Date: Dec. 26, 2018

(87) PCT Pub. No.: WO2018/020627
PCT Pub. Date: Feb. 1, 2018

(65) Prior Publication Data
US 2019/0170509 A1  Jun. 6, 2019

(51) Int. Cl.
*G01B 15/04* (2006.01)
*H01L 21/00* (2006.01)

(52) U.S. Cl.
CPC .............. *G01B 15/04* (2013.01); *H01L 21/00* (2013.01); *G01B 2210/56* (2013.01)

(58) Field of Classification Search
CPC .. H01J 37/28; H01J 2237/2817; H01J 37/317; H01J 2237/2814; H01J 37/222;
(Continued)

(56) References Cited

U.S. PATENT DOCUMENTS 10,184,790 B2 * 1/2019 Kawada ................ G01B 15/00
2003/0197873 A1 10/2003 Kazui et al.
(Continued)

FOREIGN PATENT DOCUMENTS

JP    2003-315029 A    11/2003
JP    2005-61933 A     3/2005
(Continued)

OTHER PUBLICATIONS

International Search Report (PCT/ISA/210) issued in PCT Application No. PCT/JP2016/072104 dated Nov. 15, 2016 with English translation (seven (7) pages).
(Continued)

*Primary Examiner* — David A Vanore
(74) *Attorney, Agent, or Firm* — Crowell & Moring LLP

(57) ABSTRACT

A pattern measurement method and device realize high-precision measurement of a pattern in a depth direction. The method includes forming an inclined plane in a sample region having a deep hole, a deep groove, or a three-dimensional structure, setting the field of view of a scanning electron microscope to include a boundary between the inclined plane and the sample surface, acquiring an image based on a detection signal, specifying a first position which is the boundary between the inclined plane and a non-inclined plane and a second position which is the position of a desired deep hole or deep groove positioned in the inclined plane, and calculating the height-direction dimension of a pattern constituting the circuit element having the deep hole, deep groove, or three-dimensional structure based on a dimension in the sample surface direction between the first position and the second position and the angle of the inclined plane.

8 Claims, 16 Drawing Sheets

(58) Field of Classification Search
CPC ............. H01J 2237/22; H01J 2237/221; H01J 2237/226; H01J 2237/24514; H01J 2237/24578; H01J 2237/2823; H01J 2237/2826; H01J 2237/31745; H01J 37/263; H01J 37/3056; H01J 37/3178; H01L 22/12
USPC ............ 204/192.33, 192.34, 298.32, 298.36; 250/307, 310, 492.1, 492.2
See application file for complete search history.

(56) References Cited

U.S. PATENT DOCUMENTS

| | | | | |
|---|---|---|---|---|
| 2004/0065825 | A1* | 4/2004 | Asaki | H01J 37/28 250/310 |
| 2013/0166240 | A1* | 6/2013 | Shishido | G01B 15/04 702/97 |
| 2015/0002652 | A1* | 1/2015 | Takasugi | G01B 15/00 348/80 |
| 2015/0357159 | A1* | 12/2015 | Stone | H01J 37/3056 204/192.33 |
| 2017/0138725 | A1 | 5/2017 | Kawada et al. | |
| 2017/0343340 | A1 | 11/2017 | Kawada et al. | |

FOREIGN PATENT DOCUMENTS

| | | |
|---|---|---|
| JP | 2010-127689 A | 6/2010 |
| WO | WO 2016/002341 A1 | 1/2016 |
| WO | WO 2016/092641 A1 | 6/2016 |

OTHER PUBLICATIONS

Japanese-language Written Opinion (PCT/ISA/237) issued in PCT Application No. PCT/JP2016/072104 dated Nov. 15, 2016 (five (5) pages).

* cited by examiner

[FIG. 1]
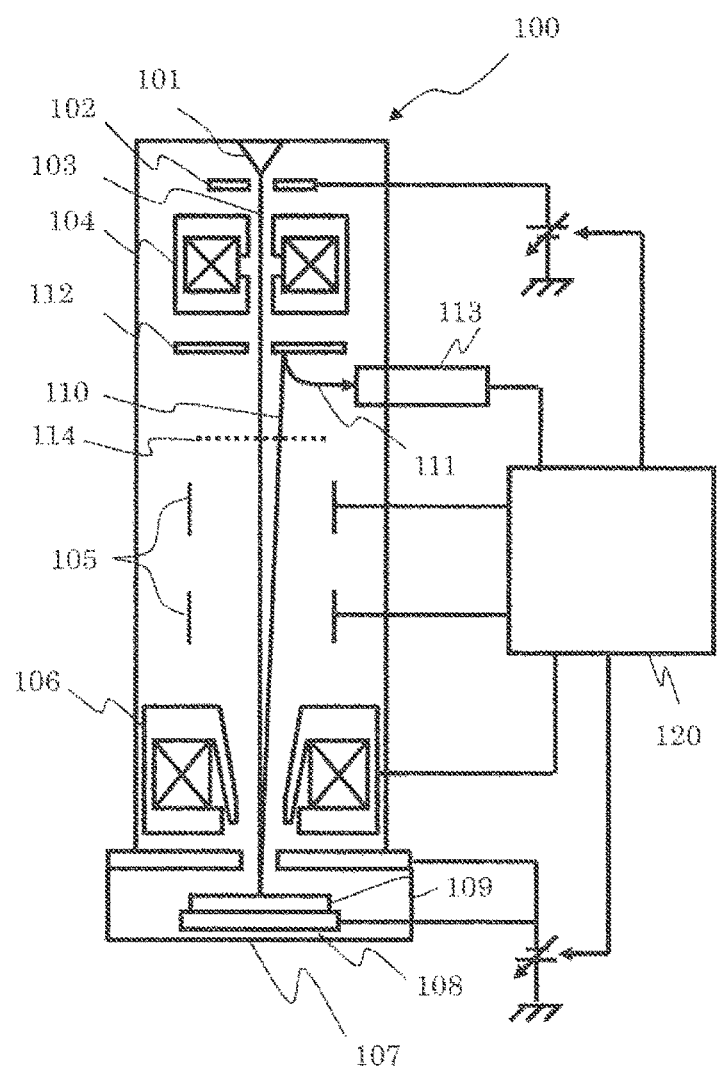

[FIG. 2]
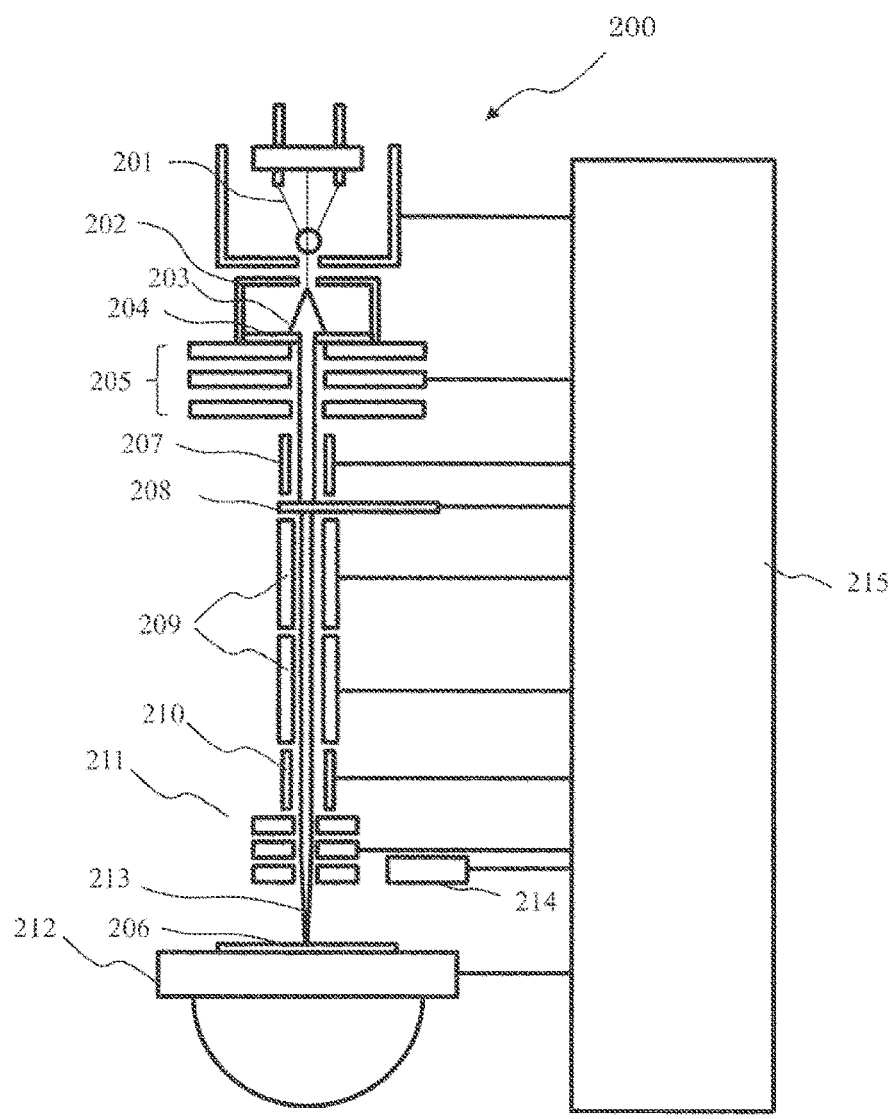

[FIG. 3]
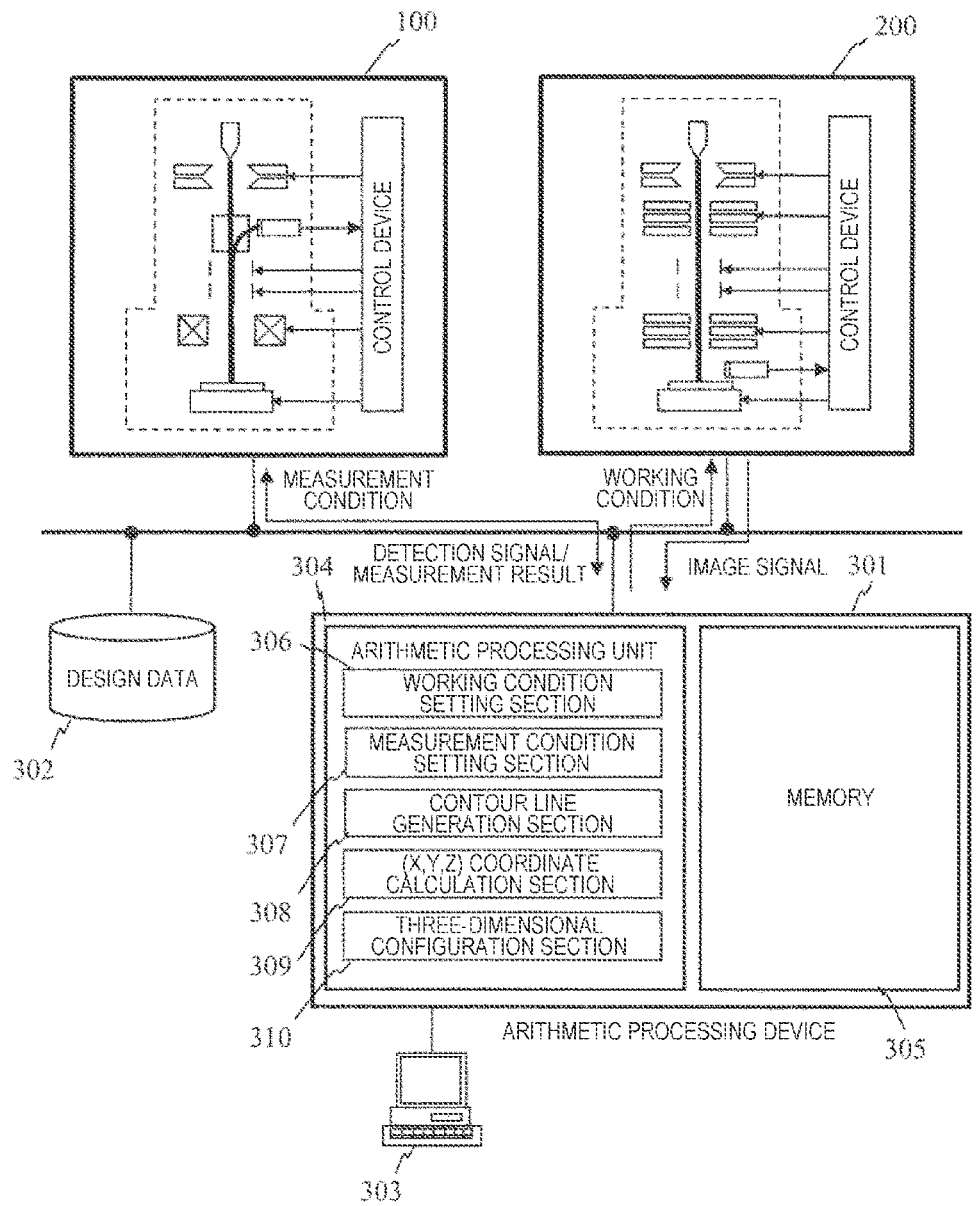

[FIG. 4]
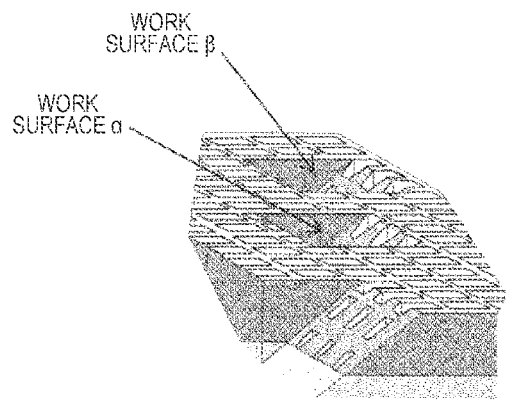
[FIG. 5]
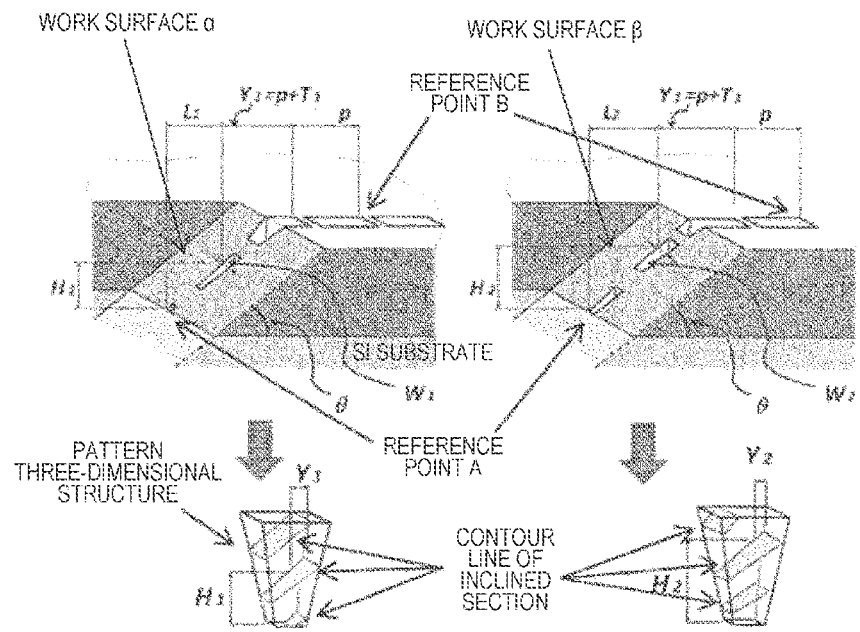

[FIG. 6]
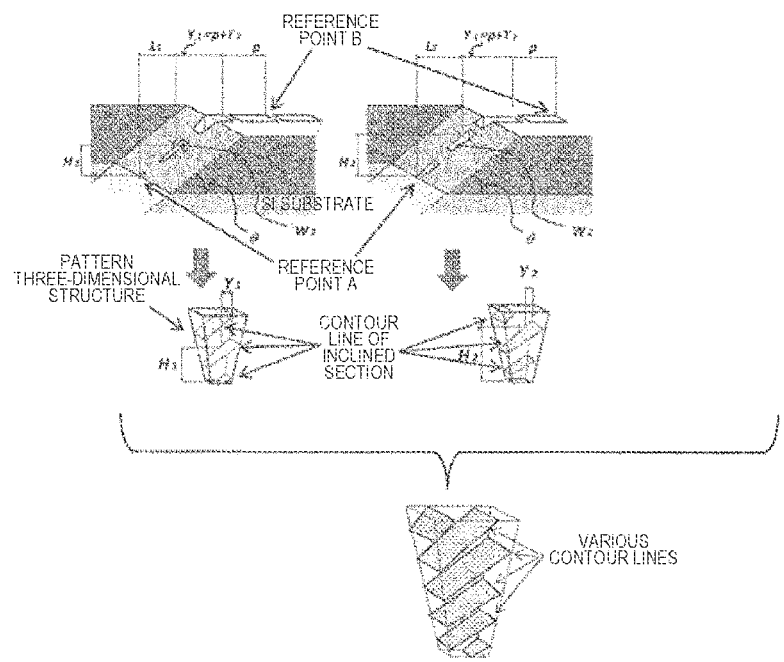
[FIG. 7]
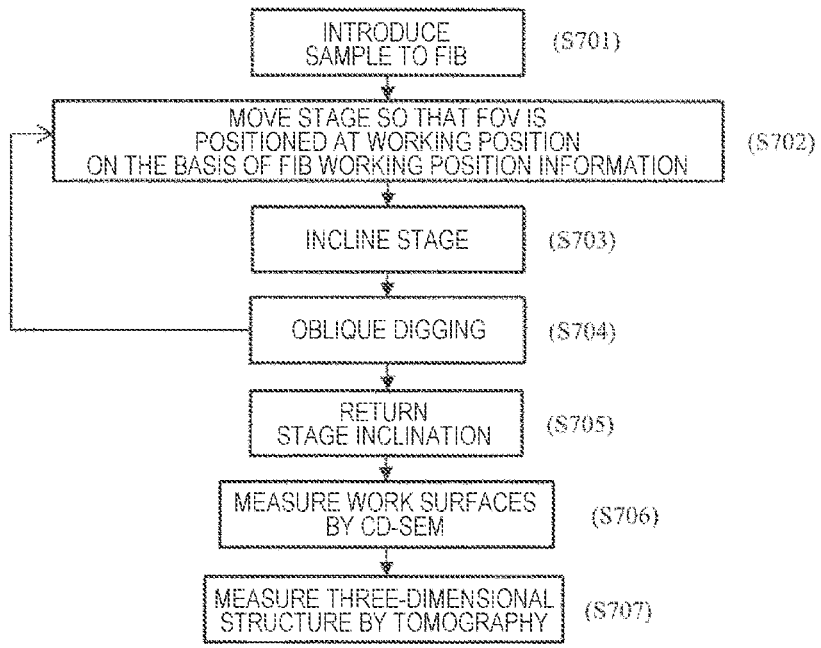

[FIG. 8]
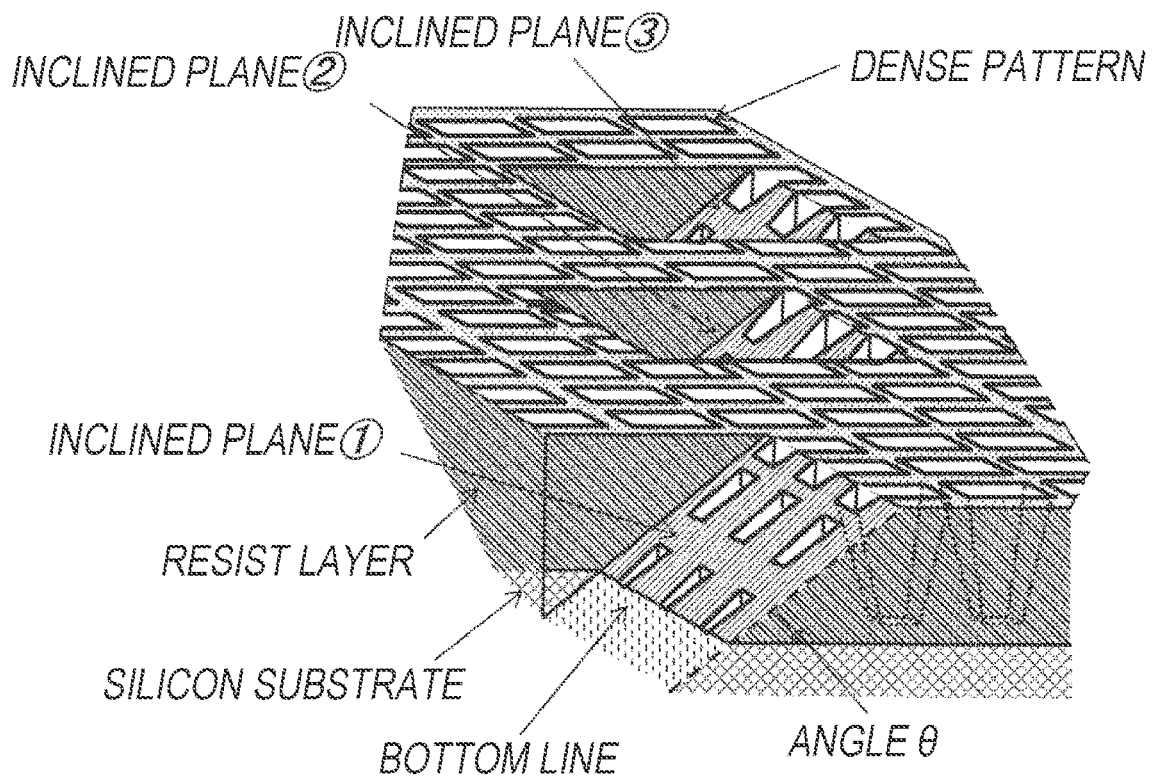
[FIG. 9]
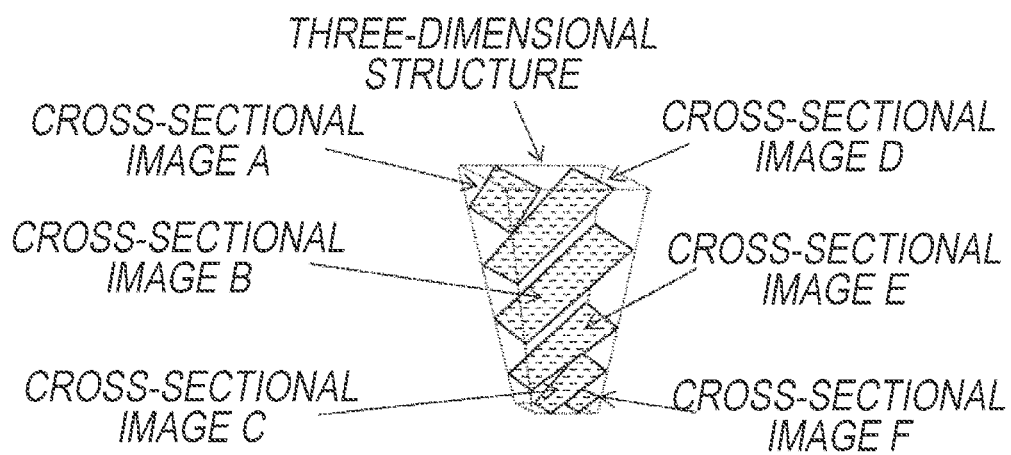

[FIG. 10]
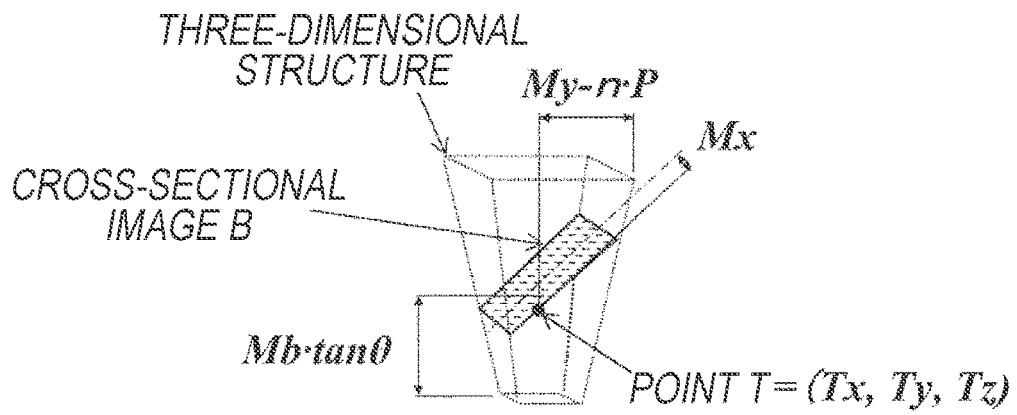
[FIG. 11]
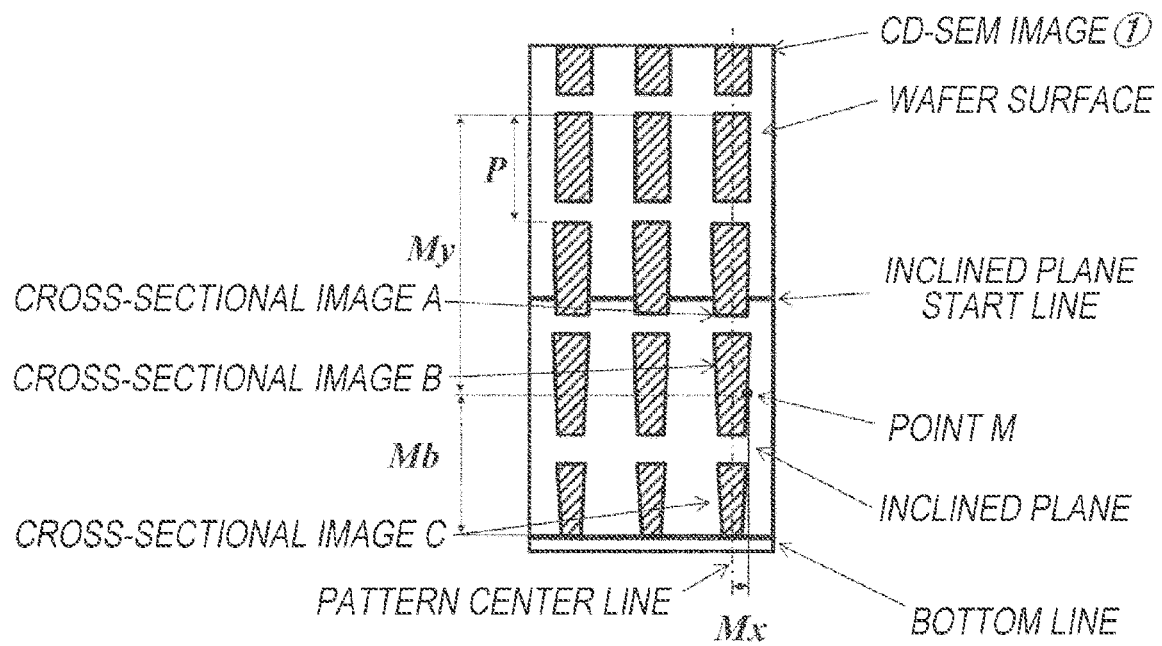

[FIG. 12]
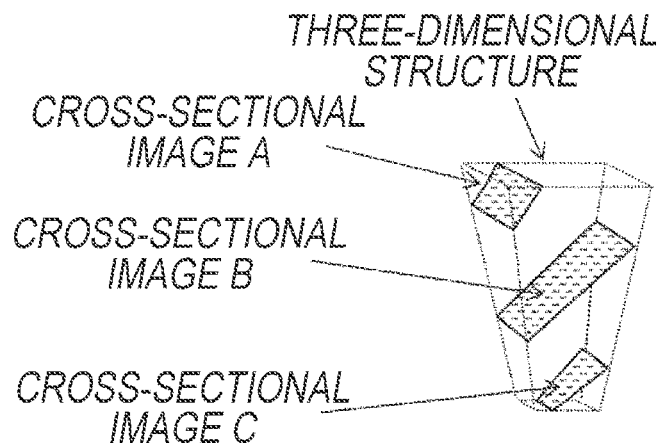
[FIG. 13]
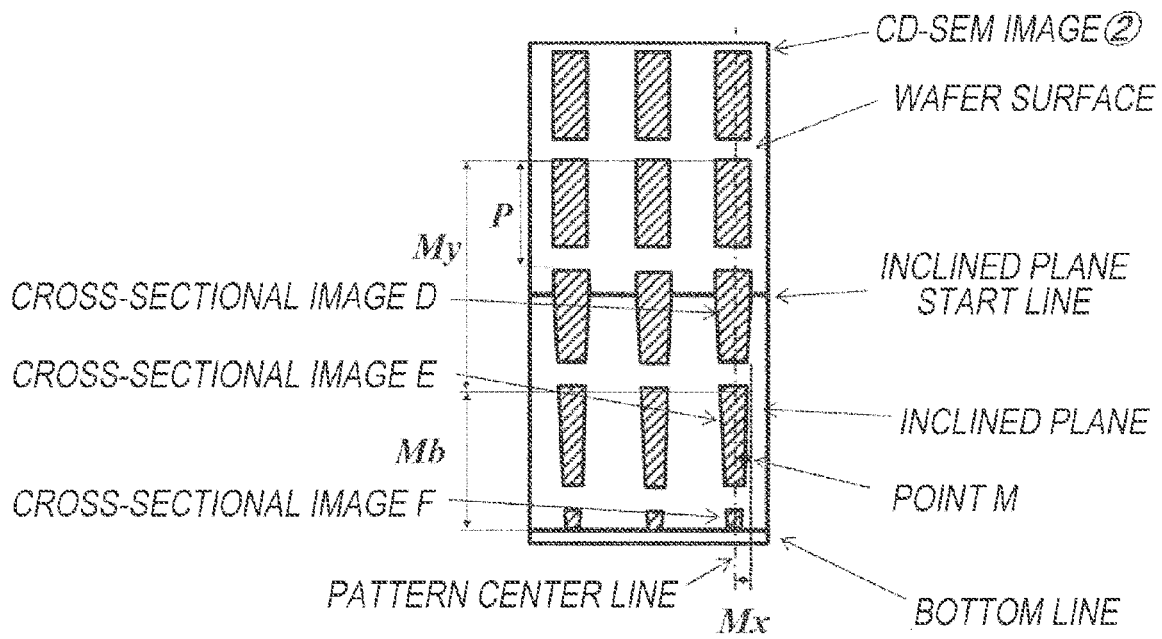

[FIG. 14]
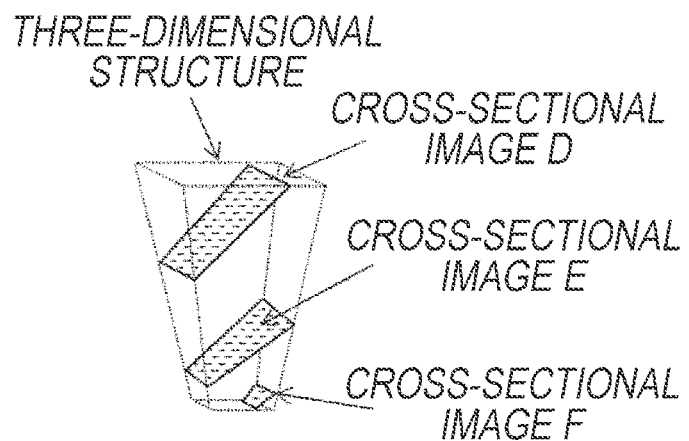
[FIG. 15]
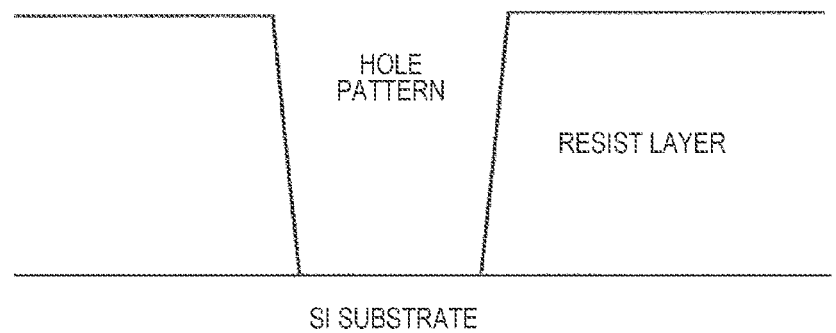

[FIG. 16]
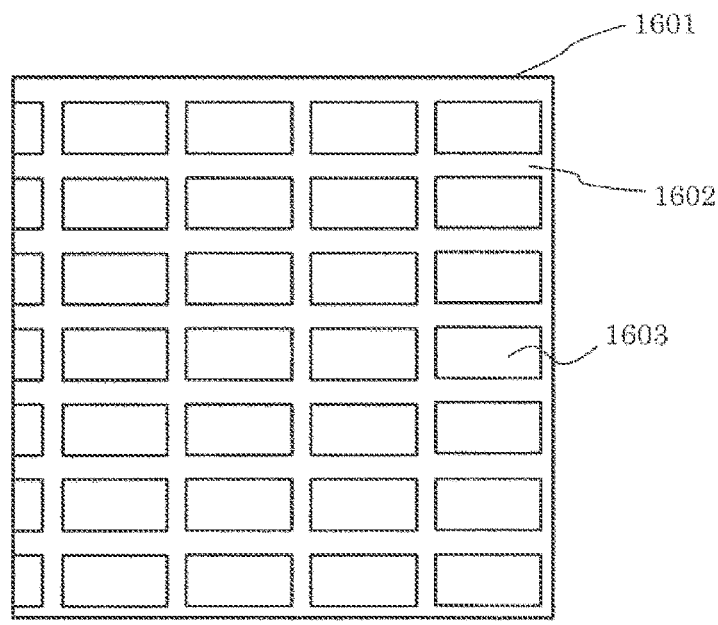
[FIG. 17]
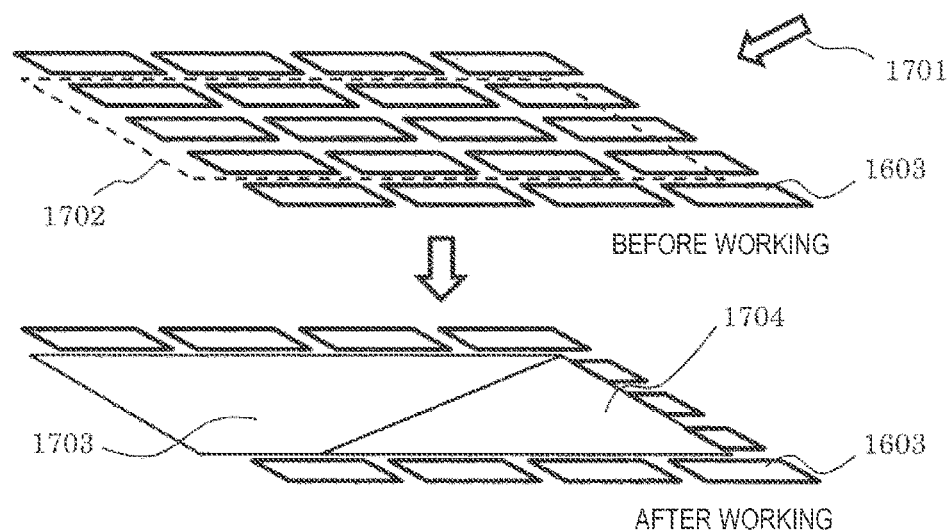

[FIG. 18]
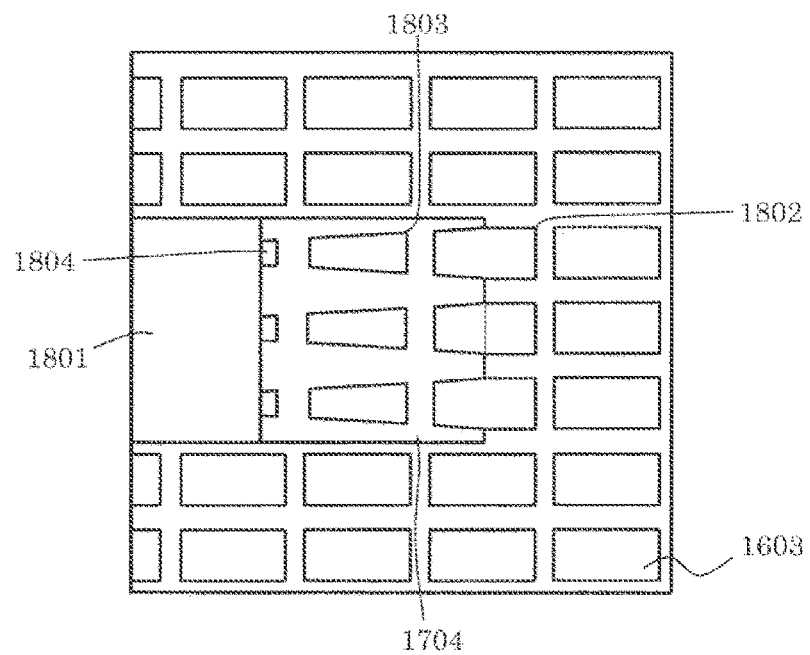

[FIG. 20]
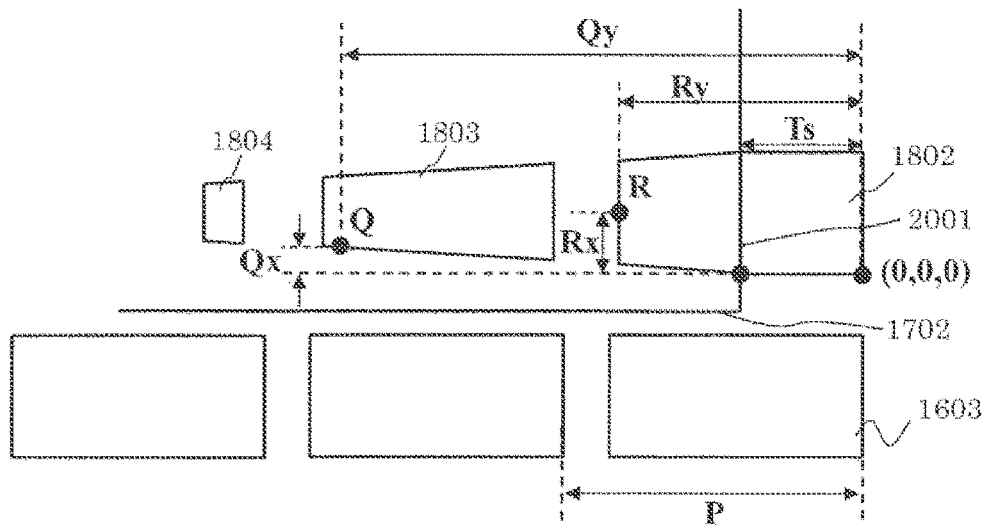
[FIG. 21]
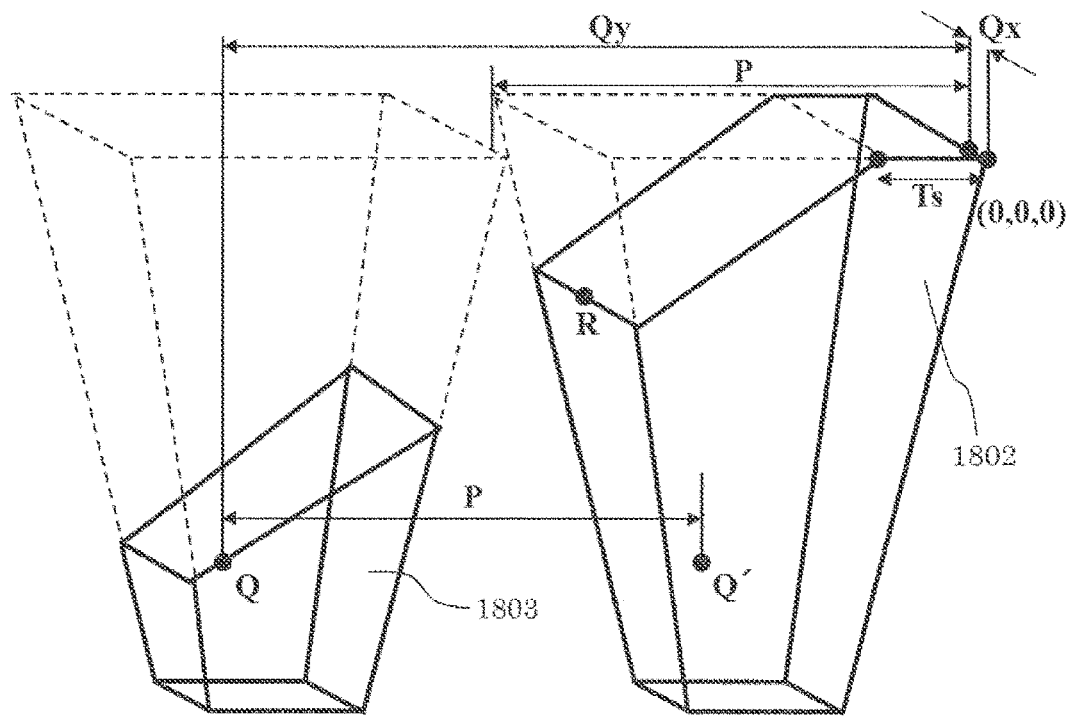

[FIG. 22]
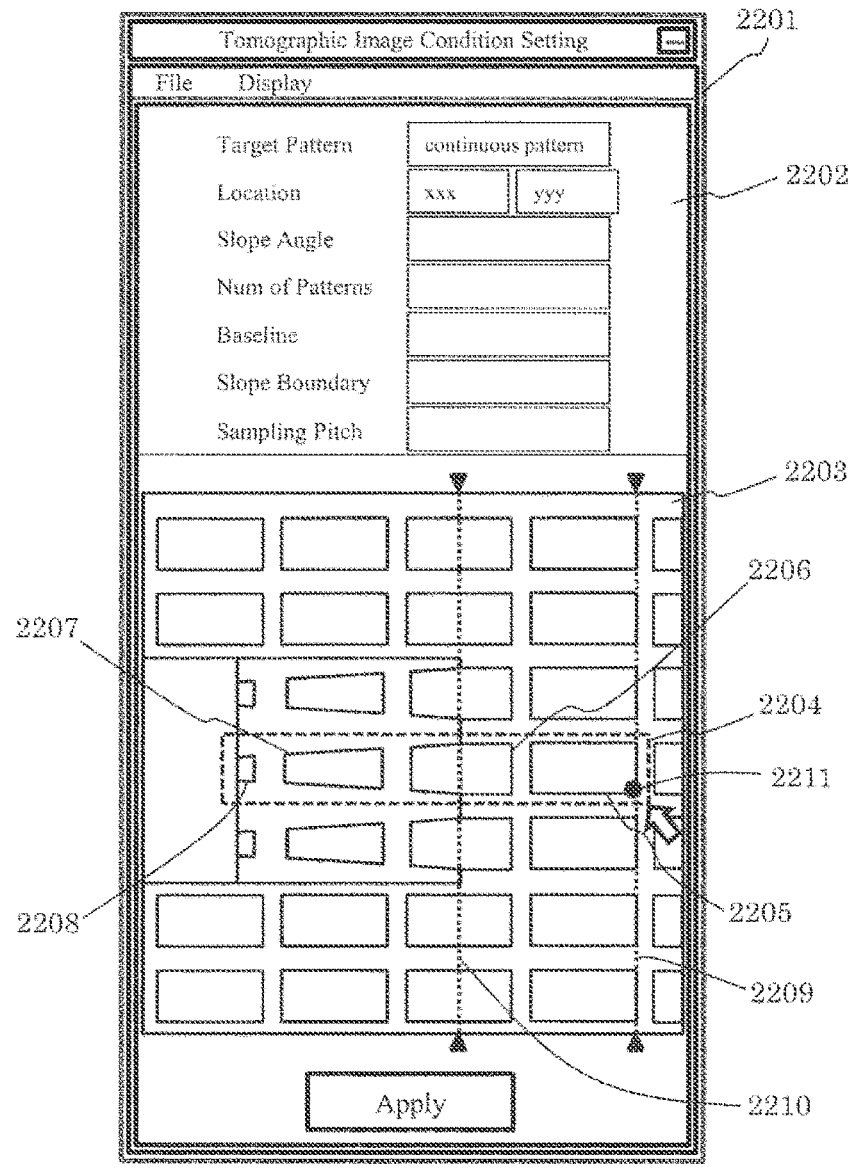

[FIG. 23]
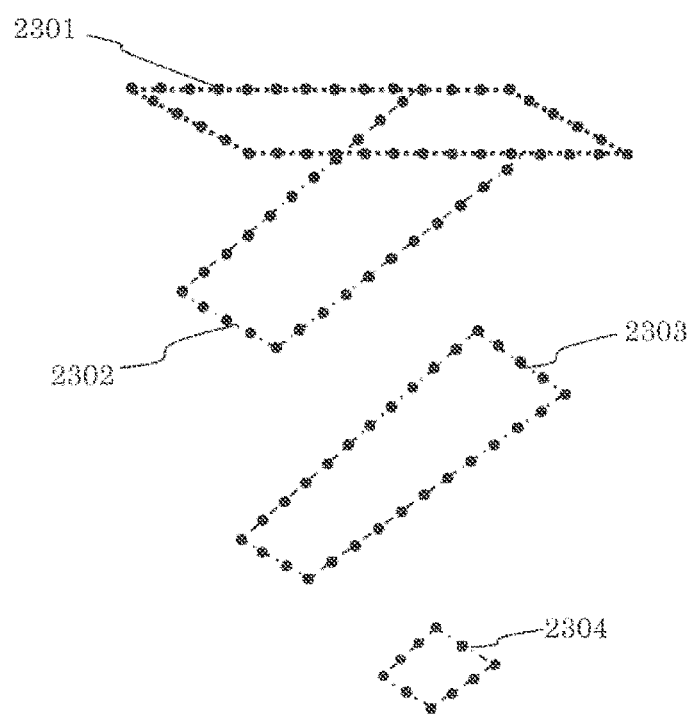

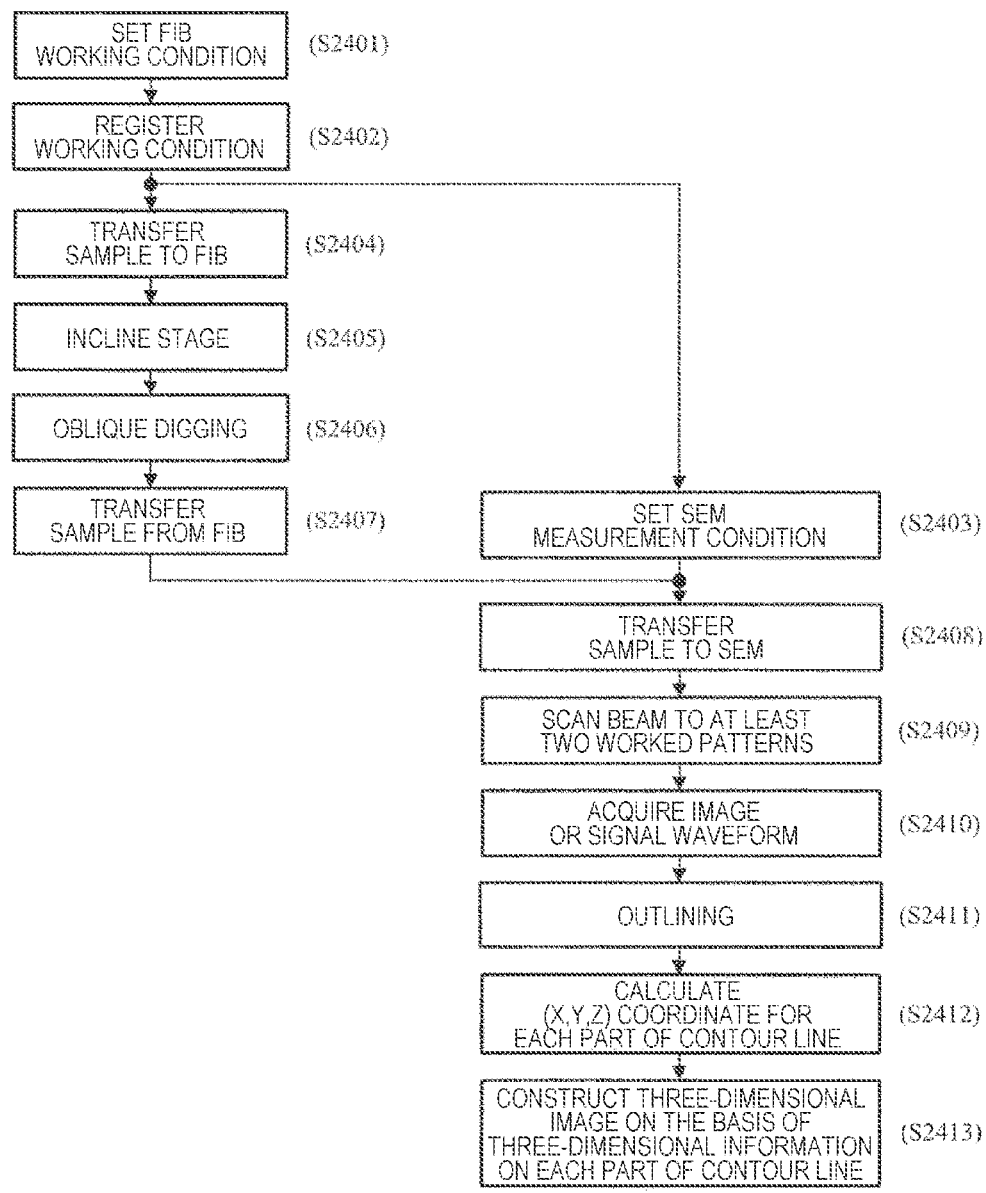
[FIG. 24]

PATTERN MEASUREMENT METHOD AND PATTERN MEASUREMENT DEVICE

TECHNICAL FIELD

The present invention relates to a pattern measurement method and a pattern measurement device, and more particularly, to a pattern measurement method and a pattern measurement device capable of accurately measuring a pattern having a three-dimensional structure.

BACKGROUND ART

In recent years, in a manufacturing process of a semiconductor device, as the semiconductor device is further miniaturized, pattern dimension management for process management becomes more important. Recently, as a pattern has a three-dimensional structure, a manufacturing method for integrating the pattern is applied. In order to manage the dimension of the pattern having a three-dimensional structure, it is necessary to evaluate the performance of the pattern in a cross-sectional direction. In order to evaluate the section of the pattern, it is considered to break a sample and observe the section of the pattern seen on a broken surface. Furthermore, it is considered to make digging in a direction perpendicular from a surface of a sample without breaking the sample, form a surface, from which a longitudinal section of the sample is exposed, in a direction perpendicular to the sample surface, and evaluate the section.

PTL 1 discloses a technique in which a tapered inclined plane is formed by focused ion beams (FIB), a dimension L between an inclined plane start point of the inclined plane and a centroid position of a pattern to be measured is measured using an electron microscope, and the depth of the pattern to be measured is calculated by solving tan θ·L (θ is a relative angle between a sample surface and the inclined plane).

CITATION LIST

Patent Literature

PTL 1: International Publication No. WO 2016/02341

SUMMARY OF INVENTION

Technical Problem

According to the technique disclosed in PTL 1, it is possible to accurately calculate the depth of a hole or a fin height of a FinFET, and it is possible to perform more accurate performance evaluation if it is possible to evaluate a three-dimensional shape of a hole and the like as well as mere depth or height.

Hereinafter, pattern measurement method and device are proposed to evaluate information on a three-dimensional shape of a pattern having a three-dimensional structure.

Solution to Problem

An aspect for achieving the object proposes a pattern measurement method or device that acquires information on a pattern formed on a sample on the basis of scanning of a charged particle beam, wherein the pattern measurement method or device includes: forming an inclined plane by irradiating an ion beam to at least a sample area including a first pattern and a second pattern different from the first pattern; acquiring a detection signal by scanning the charged particle beam to an area including the first pattern and the second pattern after the inclined plane is formed; obtaining an x coordinate and a y coordinate of each position of edges of the first pattern and the second pattern on the inclined plane on the basis of the detection signal and pitch information on the first pattern and the second pattern; and obtaining a z coordinate of each position on the basis of any one of angle information on the inclined plane, the x coordinate, and the y coordinate.

Advantageous Effects of Invention

According to the method and configuration, it is possible to acquire three-dimensional information on a pattern by using a high precise measurement device.

BRIEF DESCRIPTION OF DRAWINGS

FIG. 1 is a diagram illustrating an overview of a scanning electron microscope.

FIG. 2 is a diagram illustrating an overview of focused ion beam device.

FIG. 3 is a diagram illustrating an example of a measurement system including a SEM and a FIB device.

FIG. 4 is a diagram illustrating an example of a sample in which a plurality of parts have been subjected to inclined plane working.

FIG. 5 is a diagram for explaining pattern structure information obtained for different inclined plane working parts.

FIG. 6 is a diagram for explaining integrated information obtained by integrating edge information obtained from a plurality of inclined planes.

FIG. 7 is a flowchart illustrating a process for constructing three-dimensional structure information on a pattern.

FIG. 8 is a diagram illustrating an example of a sample in which three parts have been subjected to inclined plane working.

FIG. 9 is a diagram illustrating an example of a three-dimensional structure obtained by integrating a plurality of cross-sectional images with one another.

FIG. 10 is a diagram for explaining a principle for obtaining three-dimensional information on a pattern edge on the basis of sectional images.

FIG. 11 is a diagram illustrating an example of an electron microscope image of an inclined work surface.

FIG. 12 is a diagram for explaining an example of constructing a three-dimensional structure by using a plurality of cross-sectional images.

FIG. 13 is a diagram illustrating an example of an electron microscope image of an inclined work surface.

FIG. 14 is a diagram for explaining an example of constructing a three-dimensional structure by using a plurality of cross-sectional images.

FIG. 15 is a diagram for explaining a structure of a hole pattern.

FIG. 16 is a diagram illustrating an example of a sample in which a plurality of hole patterns are disposed.

FIG. 17 is a diagram illustrating a sample before and after inclined working.

FIG. 18 is a diagram illustrating an example of a SEM image after inclined working.

FIG. 20 is a diagram illustrating an example of a three-dimensional image construction method.

FIG. 21 is a diagram illustrating an example of a three-dimensional image construction method.

FIG. 22 is a diagram illustrating an example of a GUI screen for setting conditions for acquiring three-dimensional information on a pattern.

FIG. 23 is a diagram illustrating an arrangement example of sampling points for three-dimensional image construction.

FIG. 24 is a flowchart illustrating a three-dimensional image construction process of a pattern.

DESCRIPTION OF EMBODIMENTS

Figure 19A:
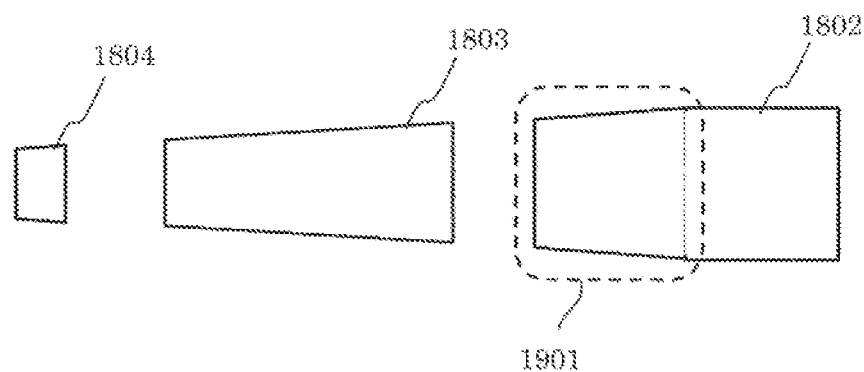
FIGS. 19A and 19B are diagrams illustrating an example of a pattern edge obtained from a SEM image.

In recent years, patterns having a miniaturized three-dimensional structure are required, and in order to stabilize a working process of the patterns, it is expected that there are increasing needs for high precisely measuring shapes and dimensions in a depth direction or a height direction of the patterns. For example, a diameter of a contact hole for electrically conducting layers of a device having a plurality of layered structure to one another is several tens of nm due to miniaturization, but a depth extends to several thousands of nm due to an increase in the number of layers caused by integration degree improvement. Furthermore, a Fin line pattern of a FinFET device having a three-dimensional structure has a cross-sectional shape in which a width is several tens of nm and a height is about several times as large as the width. Since this is a path of a switching current, it is considered that there is a need for managing the width of the line with precision of sub nm in a height direction.

On the other hand, in a mass-production process of a device, when a wafer is broken, since it is not possible to return to a process after that, the wafer is lost for each measurement in each process management and thus a yield is reduced.

Furthermore, since a time required for breaking the wafer and observing a section is about some hours, even though abnormality of a cross-sectional shape is detected, it is not possible to improve a process of a wafer manufactured in a mass-production line within some hours and thus it causes yield reduction.

Moreover, in a method for making digging in a direction perpendicular from a sample surface, since a digging volume is large and a required time including a working time becomes long, it causes yield reduction similarly.

On the other hand, in a semiconductor integrated circuit device, there are many areas where patterns having approximately the same shape are densely formed. For example, in a wafer having a diameter of 300 nm, several hundreds of chips are formed in a plane. In order to improve a manufacturing yield, it is important that the shape of the pattern is not changed at the outer periphery and the central part of the wafer. For example, on the basis of design data formed at the inner periphery and the outer periphery of the wafer, it is evaluated whether patterns having the same shape are actually formed in the same shape, so that it is possible to properly manage a yield. However, it is difficult to measure a three-dimensional structure only by using a scanning electron microscope in principle.

In order to understand a three-dimensional shape of a pattern, digging using ion beams and image acquisition of the pattern are alternately repeated, so that it is possible to acquire three-dimensional structure information on the pattern. However, when the digging is repeated, the pattern is cumulatively damaged, and due to an influence and the like of accumulation of charging on a cross-section, image quality is reduced in proportional to the digging. Furthermore, in order to high precisely perform working and measurement, a FIB device having high working precision, a scanning electron microscope capable of high precisely performing measurement (for example, critical dimension-scanning electron microscope (CD-SEM)) and the like are required, but since these are individual devices, an enormous amount of time is required for taking in/out and conveyance of vacuum.

Hereinafter, pattern evaluation method and device capable of high precisely acquiring three-dimensional information on a pattern at a high speed will be described.

The present example will describe a pattern evaluation device that performs pattern evaluation in the following steps for example.

(1) For a sample which includes at least two patterns and has been subjected to inclined plane working for reaching a lower layer of a layer with the two patterns, a distance between a point (a detection edge point) with a pattern edge and at least one of two reference points A and B is measured. The reference point A is a bottom (a surface of the lower layer) of the pattern. When a distance in a horizontal direction (for example, a y direction) from the reference point A to the detection edge point and an angle (a relative angle when a sample surface is set as a 0° direction) of an inclined plane are determined, it is possible to calculate a height of an edge point employing the bottom as a reference. Such arithmetic calculation is performed, so that it is possible to measure a Z coordinate of the edge point in a three-dimensional structure of the pattern. Furthermore, position information in a x direction can also be calculated by measuring a relative distance with a reference point included in a SEM image. It is assumed that the reference point B is not an inclined plane and a part of a pattern edge seen on a wafer surface (for example, a part of a pattern edge not subjected to inclined plane working and a pattern part (for example, an edge having a longitudinal direction in the x direction) at which a position in a y direction is easily specified). The position of the detection edge point in the y direction is measured using the reference point B as an origin, so that it is possible to specify the y coordinate of the edge point. Furthermore, similarly, for the x direction, a relative distance from a certain reference point is calculated, so that it is possible to specify an x coordinate. Furthermore, on the basis of a relative distance with the reference point B, it is also possible to calculate a z coordinate.

For each position of an edge on an inclined plane of a sample subjected to inclined plane working so as to include a plurality of patterns, three-dimensional position information is acquired, and the position information is corrected on the basis of pitch information among patterns, so that it can be defined as shape information on one pattern even though it is three-dimensional information acquired from patterns formed at different positions. Furthermore, when inclined plane working is performed such that a part of a plurality of patterns is scraped off, it is possible to acquire height information different for each pattern in accordance with positions of the patterns (for example, positions in the y direction), so that it is possible to acquire three-dimensional information on a plurality of heights without repeating working and observation.

(2) When inclined plane working is performed using a FIB device and the like, a second inclined plane working area is set at a position separated from a first inclined plane working area on a sample by several tens of micron and the positions of the working areas are adjusted such that a height of a pattern edge appearing on the second inclined plane working area is different from a height of a pattern edge appearing on the first inclined plane working area, so that it is possible to acquire many more three-dimensional information. Even for a plurality of inclined planes, since it is possible to collectively perform working without breaking vacuum of the FIB device, so that it is possible to acquire three-dimensional information on various heights without repeating the transfer of a sample to/from a vacuum sample room. Edge positions of cutting planes at various heights of a pattern are gathered, so that it is possible to perform tomography measurement of the pattern and generate a tomographic image.

In an example to be described below, a description will be mainly provided for a method and a device for obtaining information on a depth direction by forming an inclined plane obliquely descending from a sample surface with respect to an area including a part in which a pattern to be measured exists, measuring a distance between the pattern exposed to a work surface and a start position of the descending inclined plane, and calculating a distance between the sample surface in a depth direction (a Z direction when a sample surface direction before working is set as a X-Y direction) and the pattern from the start position of the descending inclined plane and a distance of the pattern in the X-Y direction.

According to the example to be described below, it is possible to measure a dimension of the pattern in the depth direction, a change in a pattern shape due to a change in a position in the depth direction, and the like without breaking a wafer. Furthermore, in a measurement method for breaking a wafer and evaluating a cross-section, when a pattern is bent in a direction perpendicular to a broken surface, it is difficult to quantitatively measure a bending direction of the pattern and a shift amount. That is, when a pattern sectional shape seen on the broken surface becomes small as a depth becomes deeper from the wafer surface, it is not possible to recognize whether the pattern is actually fine or the sectional shape becomes seemingly small on appearance because the sectional shape is bent in the direction perpendicular to the broken surface and a center is shifted from the broken surface. In contrast, according to the example to be described below, bending of the pattern in the depth direction is measured as positional shift of a pattern exposed to a cross-section dug down, so that it can be measured independently of a change in the sectional shape.

FIG. 1 is a diagram illustrating an example of a scanning electron microscope (SEM 100) used in order to acquire edge position information on a pattern formed on a sample. An extraction electrode 102 is extracted from an electron source 101, an electron beam 103 accelerated by an acceleration electrode (not illustrated) is converged by a condensing lens 104 which is a kind of a focusing lens, and then is scanned on a sample 109 one-dimensionally or two-dimensionally by a scanning deflector 105. The electron beam 103 is decelerated by a negative voltage applied to an electrode embedded in a sample stand 108, is focused by a lens action of an objective lens 106, and is irradiated onto the sample 109. An interior of a sample room 107 is maintained at a predetermined degree of vacuum by a vacuum pump (not illustrated).

When the electron beam 103 is irradiated to the sample 109, electrons 110 such as secondary electrons and back-scattered electrons are discharged from the irradiated part. The discharged electrons 110 are accelerated in an electron source direction due to an acceleration action based on a negative voltage applied to the sample, collide with a conversion electrode 112, and generate secondary electrons 111. The secondary electrons 111 discharged from the conversion electrode 112 are captured by a detector 113 and output of the detector 113 is changed by an amount of the captured secondary electrons. Due to the output, brightness of a display device (not illustrated) is changed. For example, when a two-dimensional image is formed, synchronization between a deflection signal to the scanning deflector 105 and the output of the detector 113 is made, so that an image of a scanning area is formed. Furthermore, the scanning electron microscope illustrated in FIG. 1 includes a deflector (not illustrated) that moves along a scanning area of the electron beam. The deflector is used in order to form an image and the like of patterns existing in different positions and having the same shape. The deflector is also called an image shift deflector, and enables the movement of a position of a field of view of an electron microscope without performing sample movement and the like by a sample stage. The image shift deflector and the scanning deflector may be used as a common deflector, a signal for image shift and a signal for scanning may be superimposed on each other, and the superimposed signal may be supplied to the deflector.

The example of FIG. 1 describes an example in which electrons discharged from the sample are converted in the conversion electrode and are detected; however, it is of course that the present invention is not limited to such a configuration and for example, it is also possible to employ a configuration in which an electron multiplier tube or a detection surface of a detector is disposed on the orbit of accelerated electrons.

A control device 120 controls each element of the scanning electron microscope, and has a function of forming an image on the basis of detected electrons, and a function of measuring a pattern width of a pattern formed on a sample on the basis of an intensity distribution of the detected electrons called a line profile. Furthermore, an arithmetic processing device (not illustrated) may be embedded in the control device 120, and a dimension of a pattern in a height direction may be measured on the basis of calculation formulas such as formula 1 and formula 2.

FIG. 2 is a diagram illustrating an overview of a FIB device 200 for performing inclined plane working. This device is composed of a liquid metal ion source 201 that discharges desired ions, an extraction electrode 202 that extracts ions from the liquid metal ion source 201, an aperture 204 that allows only a center of discharged ions 203 to pass downward, a focusing lens 205 that suppresses spread of the discharged ions, a blanker 207 that shifts an ion beam orbit such that ion beams do not temporarily reach the surface of a sample 206, a diaphragm 208 that adjusts a beam diameter and a beam current, an aligner 209 that corrects the ion beam orbit on an optical axis, a deflector 210 that scans and sweeps a sample surface with the ion beams, an objective lens 211 that allows the ion beams to be focused on the sample surface, a sample stand 212, a secondary electron detector 214 that captures secondary electrons discharged when focused ion beams 213 are incident on the surface of the sample 206, and the like.

The FIB device 200 is further provided with a control device 215 that controls the aforementioned each element. The control device 215 controls the ion beams 213 with a current adjusted by the diaphragm 208 to be irradiated at a predetermined working position and to be scanned by the deflector 210, thereby performing drilling of a desired area. Furthermore, the sample stand 212 includes a movement mechanism (not illustrated) and is configured such that the sample 206 can move in a X-Y direction (when the ion beam irradiation direction is set as a Z direction) and the Z direction and operations such as inclination and rotation are possible.

The control device 215 performs inclined irradiation to be described later on the sample by using the sample stand 212 or a deflector for beam tilt (not illustrated).

FIG. 3 is a diagram illustrating an example of a measurement system including the SEM 100 and the FIB device 200. The system illustrated in FIG. 3 includes the SEM 100, the FIB device 200, an arithmetic processing device (a pattern measurement device) 301, and a design data storage medium 302. The arithmetic processing device 301 includes an arithmetic processing unit 304, which supplies the SEM 100 and the FIB device 200 with a control signal including a measurement condition and a working condition and performs a process for pattern measurement on the basis of a detection signal and a measurement result obtained by the SEM 100, a recipe which is an operation program for deciding the measurement condition and the working condition, and a memory 305 that stores the measurement result and the like. The detection signal obtained by the SEM 100 is supplied to image processing hardware such as a CPU, an ASIC, and a FPGA embedded in the arithmetic processing device 301, and image processing and arithmetic calculation corresponding to a purpose are performed.

The arithmetic processing unit 304 includes a working condition setting section 306 that sets the working condition of the FIB device 200, a measurement condition setting section 307 that sets the measurement condition of the SEM 100, a contour line generation section 308 that extracts a contour line from an edge on a SEM image, a (x,y,z) coordinate calculation section 309 that calculates coordinate information on each position of the contour line on the basis of contour line information, and a three-dimensional configuration section 310 that constructs a three-dimensional image on the basis of coordinate information on each part constituting the edge. The working condition, the measurement condition and the like can be set by an input device 303, and on the basis of the setting, recipes for working and measurement are generated. Furthermore, coordinate information and the like on set working positions are stored in the memory 305 as the measurement condition of the SEM 100, and information and the like on an incident angle of ion beams are stored in the memory 305 as information to be used when the (x,y,z) coordinate calculation section 309 calculates a z coordinate. A calculation formula for calculating the z coordinate is registered in the memory 304 in advance (details will be described later). The contour line generation section 308, for example, binarizes an image obtained by the SEM 100 and performs thinning of a high brightness area (an edge part), thereby generating contour line data.

FIG. 15 is a cross-sectional view of a semiconductor device in which a resist layer is coated on a silicon substrate and a hole is formed in the resist layer. The following example describes an example in which a sample including a plurality of such hole patterns is an object to be evaluated. FIG. 16 is a diagram illustrating an example of a SEM image of a sample in which a plurality of hole patterns 1603 are formed in a resist layer 1602 coated on the silicon substrate. A three-dimensional information acquisition process of patterns formed in the sample as illustrated in FIG. 16 is illustrated in FIG. 24.

Firstly, a FIB working condition is set and registered (steps 2401 and 2402). In the present example, in order to acquire three-dimensional information on the patterns 1603, the sample is transferred to the FIB device 200 (step 2403) and a stage with the sample placed thereon is inclined (step 2405), so that ion beams are irradiated from a direction 1701 inclined with respect to a sample surface direction (step 2406) as illustrated in FIG. 17.

Furthermore, an inclination angle and a working area 1702 are set such that a plurality of patterns are juxtaposed in an inclination direction of an inclined plane. Such working is performed, so that a plurality of patterns with different working conditions are juxtaposed in the inclination direction. Ion beams are irradiated to the working area 1702 from the direction 1701, so that it is possible to form a hole 1703 having an inclined plane 1704. Moreover, in the present example, working conditions of the ion beams are set such that the inclined plane reaches a lower layer of the resist layer 1602 (a layer on which the patterns 1603 are formed).

FIG. 18 is a diagram illustrating an example of an image obtained by scanning electron beams to the sample after the ion beam working. FIG. 18 illustrates an example in which a working depth by the ion beams reaches a Si substrate layer 1801. As described above, the sample is subjected to working such that the working depth reaches the lower layer, so that an inter-layer boundary can be employed as a reference for specifying a position of the pattern in a height (depth) direction as will be described later. In the example of FIG. 18, FIB working is performed across a plurality of patterns in the inclination direction. Specifically, the inclined plane 1704 is formed to traverse patterns 1802 to 1804. Such an inclined plane is formed, so that it is possible to expose edges of patterns with different heights to the inclined plane.

Figure 19B:
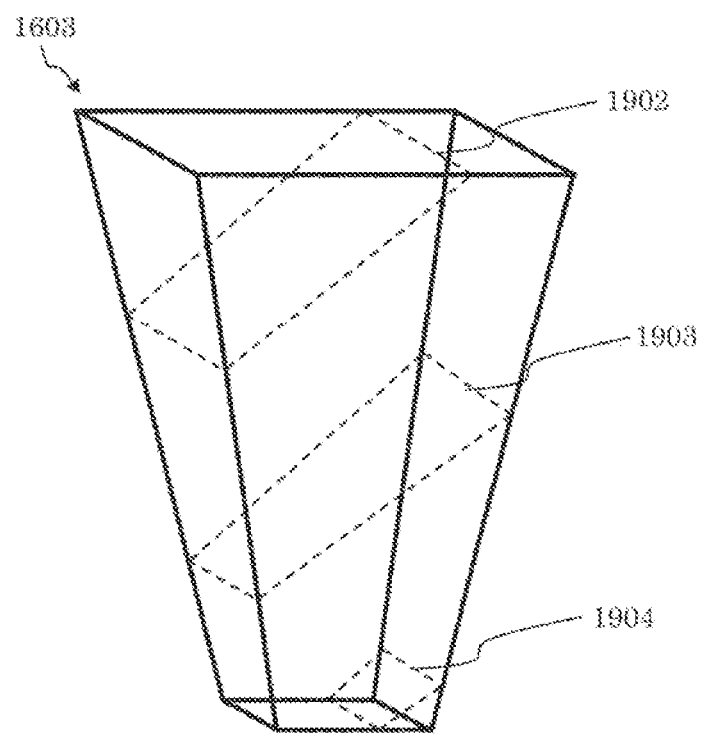

As illustrated in (a) of FIG. 19, contours of the patterns 1802 to 1804 on the inclined plane 1704 correspond to contours 1902 to 1904 of the patterns 1603 illustrated in (b) of FIG. 19. That is, when information on these contours can be integrated as contour information on one pattern, it is possible to reproduce a three-dimensional structure of the pattern.

A specific three-dimensional image construction method will be described using FIG. 20 and FIG. 21. FIG. 20 illustrates a part of an image formed on the basis of a signal obtained by scanning electron beams to a part of the sample subjected to the inclined plane working. After the inclined plane working, the sample is transferred from the FIB device (step 2407), the measurement condition of the SEM 100 is set, and then the sample subjected to the inclined plane working is transferred to the SEM 100 (steps 2403 and 2408). The measurement condition of the SEM 100, for example, includes a stage coordinate, a multiplication (a size of a field of view), landing energy of electron beams, and the like. Since the working area of the FIB device 200 and the image acquisition area of the SEM 100 approximately coincide with each other, the scanning position of the electron beams may be automatically set on the basis of the working position information set in the working condition setting of step 2401. Furthermore, in the present example, on the basis of beam irradiation (step 2409) to at least two patterns and an area where a pitch between patterns can be specified on an inclined plane, three-dimensional information on patterns is acquired.

In addition, for the field of view of the SEM, a pattern to be measured may be included in one field of view in order to collectively acquire necessary information, and in order to achieve high precise measurement, a plurality of fields of view may set for each part to be measured. When a plurality of fields of view are set, it is desired to perform image acquisition while providing a superposition area such that a relative positional relation can be understood. Fields of view are set between the positions of fields of view so as to connect separated positions of fields of view to each other, and a process is performed to connect the fields of view to each other, so that it is possible to high precisely measure a distance between the fields of view even though the fields of view are separated from each other.

In the present example, on the basis of a signal obtained by beam scanning to at least two patterns, an image or a signal waveform is acquired (step 2410), and outlining of the signal is performed, so that information on an edge along an inner wall of a hole pattern is extracted (step 2411). For each part of the contour line, (x,y,z) coordinates are calculated (step 2412) as will be described later, and on the basis of three-dimensional coordinate information on each part, a three-dimensional image is constructed (step 2413).

Hereinafter, a description will be provided for a specific process for calculating (x,y,z) coordinates for each part of an edge and performing three-dimensional image construction by using a plurality of (x,y,z) coordinates. The present example describes an example in which a corner of the pattern 1802 not subjected to the ion beam working is employed as a reference position (0,0,0) and three-dimensional information on each part of a hole pattern is acquired. The present example describes an example in which three-dimensional information (x,y,z coordinates) on a point R and a point Q' of the pattern 1802 is obtained. Since the point R is displayed on a SEM image, relative distances (Rx,Ry) in a xy direction with respect to the reference position correspond to XY coordinates. Furthermore, since the angle θ of the inclined plane of the working area 1702 is an angle arbitrarily set and is already known, it is possible to calculate a z coordinate of the point R by solving (Ry−Ts)×tan θ.

Next, the three-dimensional information on the point Q' is obtained. Since the point Q' is an internal point of the pattern 1802 and hardly appears on the SEM image, the three-dimensional information is calculated by specifying a coordinate of a point Q which is a corresponding position of an adjacent pattern 1803. Firstly, for a x coordinate, a relative distance Qx in a x direction with the reference position (0,0,0) is employed as the x coordinate of Q' on the assumption that there is no shift between the patterns 1802 and 1803 in the x direction. When a shift exists between the patterns 1802 and 1803 in the x direction and can be specified, it can be added as a shift amount. For a y coordinate, a distance Qy between the reference position (0,0,0) and the point Q is calculated and a pitch P of the pattern 1802 and the pattern 1803 is subtracted from Qy (Qy−P), so that the distance Qy is employed as the y coordinate of Q'. A z coordinate is obtained by solving (Qy−Ts)×tan θ.

As described above, a process is performed to perform the inclined plane working across a plurality of patterns, to specify positions of coordinates of edges of a plurality of patterns exposed to a sample surface, and to convert an edge coordinate of one pattern to an edge coordinate of another pattern by using information on a pitch between the plurality of patterns, so that it is possible to acquire three-dimensional information based on position specifying of edges having various depths. For example, as illustrated in FIG. 20, when the patterns 1603 and 1802 to 1804 are displayed on the SEM image, it is possible to reproduce three-dimensional information as illustrated in FIG. 23. Three-dimensional information on edges 2302 to 2304 of FIG. 23 can be respectively constructed from coordinate information specified from the patterns 1802 to 1804. Furthermore, since a part of an edge 2301 appears on a sample surface before inclined working, the part may be used, and a part lost in the inclined working may be reproduced on the basis of a relative positional relation between the pattern 1603 and the pattern 1802.

By the above procedure, it is possible to obtain three-dimensional relative distances of each part of a pattern with respect to a reference point and to construct an accurate three-dimensional image.

Next, a description will be provided for a procedure of generating an operation recipe for automatically performing the aforementioned three-dimensional information acquisition. FIG. 22 is a diagram illustrating an example of a GUI screen for registering a measurement condition. The GUI screen, for example, is displayed on a display device of the input device 303, and a measurement condition for three-dimensional construction is set on the basis of input using the input device 303. On a GUI screen 2201 illustrated in FIG. 22, a parameter input unit 2202 and a SEM image display area 2203 are displayed. The parameter input unit 2202 can receive a name (Target Pattern) of a pattern to be measured, a coordinate (Location) of the pattern, an angle (Slope Angle) of an inclined plane formed on a sample, the number (Number of patterns) of patterns for arithmetic calculation, a position of a boundary (Baseline) serving as a reference of the arithmetic calculation, a position of a boundary (Slope Boundary) between a sample surface and the inclined plane, and a sampling pitch (an interval of arithmetic calculation places of an edge position). Furthermore, since the angle of the inclined plane, the coordinate of the pattern and the like are information required when FIB working is performed, the measurement condition may be automatically set on the basis of setting information on the FIB device. Furthermore, setting using a pointing device and the like may be performed on the SEM image display area 2203 as well as numerical value input. Specifically, patterns to be evaluated may be selected using an area selection unit 2204 that selects an area and allows three-dimensional information calculation using a pattern included in the area to be performed. In the example of FIG. 22, patterns 2205 to 2208 are selected as patterns to be evaluated.

Moreover, a measurement reference position 2206 and a measurement reference line 2209 are set by the pointing device and the like, so that arithmetic calculation may be performed employing a point and a line as a reference. In the example of FIG. 22, a corner of the pattern 2205 is selected as a reference point. When such selection is performed, the aforementioned arithmetic calculation is performed employing the measurement reference position 2211 as a point (0,0,0). A slope boundary setting unit 2210 sets a slope boundary between the inclined plane and the sample surface. In addition, the example of FIG. 22 has described an example for manually setting parameters required for three-dimensional information calculation on the GUI screen; however, for example, the slope boundary and the like between the inclined plane and the sample surface may be automatically extracted using image processing and the like.

In the above description, the image processing device that constructs a three-dimensional image on the basis of one inclined plane working has been described; however, an example of an image processing device that constructs a high precise three-dimensional image on the basis of two or more inclined plane working will be described below. More specifically, a description will be provided for a pattern measurement method that includes a step of irradiating focused ion beams such that a pattern to be measured or an edge is included in a working area and an inclined plane is formed in the working area by the focused ion beams, a step of setting the field of view (FOV) of the scanning electron microscope in at least two areas of the pattern to be measured or a first part of the pattern and a slope boundary between the inclined plane and the sample surface or a second part of the pattern and acquiring respective detection signals and a step of measuring a dimension of the sample surface direction on the basis of the detection signals obtained from the fields of view of at least the two areas, and calculates a dimension between the pattern to be measured or the first part and the slope boundary or the second part on the basis of the dimension of the sample surface direction and an angle of the inclined plane.

Moreover, a description will be provided for a pattern measurement device that measures a dimension of a pattern formed on a sample on the basis of a detection signal obtained by the scanning electron microscope, and includes an input device that sets, on a first image obtained by the scanning electron microscope, a first field of view smaller than a field of view of the first image, a second field of view being a position different from that of the first field of view and smaller than the first field of view of the first image, and a length measurement cursor for extracting at least one of a first part and a second part serving as a pattern measurement reference in at least one of the first field of view and the second field of view, and an arithmetic processing device that specifies the first part of the pattern in the length measurement cursor of the first field of view set by the input device, specifies a boundary between the sample surface and the inclined plane or the second part of the pattern in the length measurement cursor, which has been set in the second field of view, in the second field of view, and measures a dimension between the first part and the boundary or the second part.

Hereinafter, a method and a device for acquiring information on a depth direction will be described more specifically with reference to the drawings.

On the other hand, a critical dimension-scanning electron microscope (CD-SEM) having a function of measuring a dimension of a pattern is required to have a high resolution in order to measure a dimension of a fine pattern high precisely. In order to achieve the high resolution, a distance (a working distance) between a sample surface and an objective lens needs to be short, and it is actually difficult to incline a large sample such as a wafer in a restricted space. Hereinafter, a description will be provided for a technique for obtaining information on a height direction (a z direction) by irradiating beams from a direction perpendicular to the sample surface and a device for performing the technique.

In the present example, after the inclined plane formation working is performed by the FIB having the configuration illustrated in FIG. 2, information on the inclined plane working is acquired by detecting a signal obtained by irradiating beams from a direction which is perpendicular to the sample surface (the sample surface of a non-working area of FIG. 4), on which patterns having the same three-dimensional structure as illustrated in FIG. 4 are regularly and densely formed and intersects with the inclined work surface. Since a pattern to be measured or a cross-sectional shape exposes on the inclined work surface, it is possible to capture a position of the pattern by image acquisition through the CD-SEM.

The inclined work surface is formed in a plural number, and at least two inclined work surfaces or two or more inclined work surfaces are formed at different places with respect to a three-dimensional structure seen on the sample surface. In the actual example, two work surfaces of a work surface α and a work surface β are formed such that work surfaces start to be inclined from different positions with respect to a three-dimensional structure seen on the sample surface.

FIG. 5 illustrates these two work surfaces. A boundary between a resist layer coated on the sample surface and a lower Si substrate is seen to the work surface, and a point, at which a bottom of the three-dimensional structure of the pattern is seen on the boundary, is employed as a reference point A. In the work surface α, when a height H of a point Y on a cross-section thereof can be expressed by formula 1 below when a distance from the reference point A measured by the CD-SEM is expressed by L and a distance with a pattern to be measured or a cross-sectional shape is L when viewed from directly above with respect to the sample surface.

$$H = L \times \tan \theta \qquad \text{[Formula 1]}$$

On the other hand, in patterns regularly juxtaposed on the sample surface and having the same shape, a point indicating a reference position when the patterns are observed by the CD-SEM from directly above is employed as a reference point B. In such a case, a distance from the reference point B of the point Y can be expressed by formula 2 below.

$$Y1 = P + T1 \qquad \text{[Formula 2]}$$

In Formula 2 above, P denotes a pitch with which the pattern is juxtaposed when viewed from directly above and T1 denotes a distance from the reference point B in one pattern. When H and T1 are measured at each place on the cross-section on the work surface, it is possible to obtain a cross-sectional shape when a part of the three-dimensional structure is taken along an obliquely traversing plane as a consequence. This corresponds to the contour line of the inclined plane in FIG. 5. If the pitch of the pattern is sufficiently smaller than a depth of the pattern, two or more contour lines are obtained from one work surface. Furthermore, when work similar to this is performed for the work surface 3, it is possible to obtain a different contour line.

In FIG. 6, the plurality of obtained contour lines are incorporated into one three-dimensional structure, so that it is possible to express the three-dimensional structure by the plurality of contour lines. This is so-called tomography measurement of a three-dimensional structure.

The above is an example when two different work surfaces are formed; however, more precise tomography measurement is possible by increasing different work surfaces. That is, as illustrated in the flowchart of FIG. 7, in the initial FIB working, a plurality of different work surfaces are formed in a pattern dense area, for example, at a distance of several microns. The positions of the plurality of work surfaces need not to be decided in advance, and the positions may be random according to occasions or an operator may instantly decide an appropriate place through observation and form a plurality of work surfaces.

After the working is ended, the sample is moved to the CD-SEM and the measurement described in FIG. 5 is performed. The positions of the work surfaces need not to be understood in advance, and when the measurement and the calculation of Formula 1 and Formula 2 are performed each time on the image measured by the CD-SEM, contour lines of various three-dimensional structures are obtained from a plurality of work surfaces as described in FIG. 6.

By so doing, very speedy tomography measurement becomes possible. It is considered to measure a cross-sectional structure each time while slightly digging a specific pattern structure by the FIB working, thereby reproducing an entire shape of the three-dimensional structure;

however, there is a case where the pattern structure is slightly damaged in each working, or due to an influence and the like of accumulation of charging on a cross-section, image quality is reduced as the digging is performed. Furthermore, when it is assumed that high precise cross-section measurement based on high precise CD-SEM measurement is performed, since it is necessary to transfer a sample between a device that performs the FIB working and the CD-SEM, an enormous amount of time is required for taking in/out and conveyance of vacuum.

FIG. 8 is a diagram illustrating an example of a semiconductor pattern from which three-dimensional information is extracted. There is a resist layer on a silicon substrate and dense patterns are formed thereon. In the present example, rectangular holes are formed in a wafer surface and the rectangle becomes small as a depth becomes deeper. Since the patterns are formed to be identical to one another, all are regarded to have approximately the same shape and structure in the vicinity of about several microns for example.

In an area of the dense patterns, inclined planes 1 to 3 having an inclination angle θ are formed by the FIB working. An image obtained when a sample subjected to such working is scanned with electron beams from a direction perpendicular to the sample surface is acquired using the CD-SEM, so that shapes and positions of respective inclined sections in the three-dimensional structure are calculated and the three-dimensional structure is quantitatively measured. FIG. 9 illustrates a three-dimensional structure of patterns and inclined sections A to E when the three-dimensional structure is taken along an obliquely traversing plane at the same inclination angle.

With reference to FIG. 10, a description will be provided for a method for calculating a coordinate (Tx,Ty,Tz) of a point T positioned on a contour line of the inclined section B in the three-dimensional structure. FIG. 11 is a diagram illustrating an example of a SEM image (a CD-SEM image 1) of the inclined section B included in the inclined plane 1 of FIG. 8. This is an image obtained by irradiating beams from a direction perpendicular to the wafer surface. When it is an image observed from the inclination direction, it is sufficient if the inclination angle is reflected in calculation in the following example.

The CD-SEM image 1 includes a wafer surface, an inclined plane formed by the FIB working, and an inclined plane start line from which the inclined plane starts down from the wafer surface. The inclined plane includes three types of cross-sectional images of a pattern. It is assumed that a point on one contour line thereof is set as M and this point is a point corresponding to a point M on the contour line of the inclined section B of the aforementioned three-dimensional structure. Hereinafter, a description will be provided for a method for obtaining the XYZ coordinates of the point T on the inclined section of the three-dimensional structure by measuring the point M of the CD-SEM image 1.

In the CD-SEM image 1, a center line of patterns, which include the inclined section included in the point M and are juxtaposed in a longitudinal direction, is decided. When a distance in a horizontal direction between the center line and the point M is set as Mx, Tx=Mx. In the CD-SEM image 1, a boundary between the resist layer and the substrate is taken in a line shape and is called a bottom line. In the present example, the bottom line is horizontal in the CD-SEM image; however, when the line B is not horizontal, the image is rotated to be horizontal. In the image, when a distance in the vertical direction between the line B and the point M is set as Mb, Tz=Mb·tan θ. Herein, θ is an angle of the inclined plane.

In the CD-SEM image 1, when one pattern not existing in the inclined plane and existing in the wafer surface is selected and a distance in the longitudinal direction between a part remotest from the point M in the contour line of the pattern and the point M is set as My, Ty=My−n·P. Herein, P denotes a pitch dimension of the pattern in the longitudinal direction on the wafer surface and n denotes a maximum integer satisfying My>n·P. For example, in FIG. 11, since My is measured by employing sides of two adjacent patterns as a reference, it is necessary to drive two lengths of the pitch dimension from My. In order to automatically perform such setting, it may be possible to prepare an algorithm for automatically selecting a reference pattern from a plane other than the inclined plane, automatically counting a sequence of a pattern to be measured, which is positioned on the inclined plane, from the reference pattern, and automatically deciding n.

By using the arithmetic processing device stored with a program for performing the above procedure, all edge points on the contour line of the inclined section B are regarded as the point M and the XYZ coordinates of the point T on the contour line of the inclined section B corresponding to the point M are obtained. By so doing, it is possible to obtain a three-dimensional coordinate of the inclined section B. Next, similar measurement is performed for the inclined section C to obtain a three-dimensional coordinate of the inclined section C. Furthermore, similar measurement is also performed for a contour line of a part on the inclined section A, so that a three-dimensional coordinate of the inclined section is obtained.

The above process is performed, so that three-dimensional information on the inclined sections A to C is obtained as illustrated in FIG. 12.

The above method is further repeated, so that it is possible to obtain a structure of a different inclined section. For example, the inclined plane 2 of FIG. 8 is observed from a top-down direction with respect to the wafer surface, so that a CD-SEM image 2 illustrated in FIG. 13 is obtained. From inclined images D to F included in the CD-SEM image 2, three-dimensional coordinates of the inclined images D to F can be obtained, and a three-dimensional structure including the inclined images D to F as illustrated in FIG. 14 can be reproduced.

When the structure information of FIG. 12 and the structure information of FIG. 14 are integrated with each other, it is possible to construct the three-dimensional structure based on the six inclined sections illustrated in FIG. 9. Moreover, as with the inclined plane 3 of FIG. 8, when similar measurement is performed in an inclined plane from which a cross-section at a height different from that of the inclined plane 1 or the inclined plane 2 is seen, it is possible to interpolate edge information among the six inclined sections of FIG. 9.

By so doing, it is possible to measure a three-dimensional structure of dense patterns by a tomography method for deciding a three-dimensional structure from many inclined sections.

As compared with a technique in which cross-sections subjected to FIB working are observed and observation of slight scraping of the FIB is repeated, in order to efficiently perform measurement, a plurality of inclined planes are formed in advance in the FIB working and the inclined planes are collectively measured in CD-SEM measurement, so that working, observation, and measurement can be collectively performed, it is possible to shorten a processing time.

Furthermore, a place where working of the FIB device is performed on an inclined plane needs not to be positioned high precisely, and for example, may be randomly positioned. When relative positions to dense patterns differ in each inclined plane due to a variation, it is possible to measure cross-sections passing many positions because it is convenient in tomography measurement. Moreover, among parameters appearing in the calculation formulas in the present measurement method, a parameter having precision depending on the FIB device is only the angle θ of the inclined plane. Since this is a mechanical inclination angle of a sample stand, there is sufficiently high precision of about 0.10.

Other parameters are parameters collectively measured after the wafer is moved to the CD-SEM. In general, since the CD-SEM is a device that can perform high precise measurement at a nanometer level and thus performs adjustment and calibration, there is a merit that it is possible to perform high precise measurement without special preparation in the aforementioned measurement or depending on the precision of the FIB device.

100: SEM
101: electron source
102: extraction electrode
103: electron beam
104: condensing lens
105: scanning deflector
106: objective lens
107: vacuum sample room
108: sample stand
109: sample
110: electron
111: secondary electron
112: conversion electrode
113: detector
120: control device
200: FIB device
201: liquid metal ion source
202: extraction electrode
203: discharged ion
204: aperture
205: focusing lens
206: sample
207: blanker
208: diaphragm
209: aligner
210: deflector
211: objective lens
212: sample stand
214: secondary electron detector
215: control device
301: arithmetic processing device
302: design data storage medium

The invention claimed is:

1. A pattern measurement method that acquires information on a pattern formed on a sample on the basis of scanning of a charged particle beam, the method comprising:
   forming a first inclined plane by irradiating an ion beam to a sample area including at least a first pattern and a second pattern different from the first pattern;
   acquiring a detection signal by scanning the charged particle beam to an area including the first pattern and the second pattern after the inclined plane is formed;
   obtaining an x coordinate and a y coordinate of each position of edges of the first pattern and the second pattern on the inclined plane on the basis of the detection signal and pitch information on the first pattern and the second pattern; and
   obtaining a z coordinate of each position on the basis of any one of angle information on the inclined plane, the x coordinate, and the y coordinate.

2. The pattern measurement method according to claim 1, wherein
   from a detection signal obtained by scanning the charged particle beam to a second inclined plane formed at a position different from a position of the first inclined plane, x coordinate information and y coordinate information on each position of an edge of a third pattern formed on the second inclined plane are obtained, and
   z coordinate information on each position of the edge of the third pattern is obtained on the basis of any one of the x coordinate information and the y coordinate information on each position of the edge of the third pattern and angle information on the second inclined plane.

3. The pattern measurement method according to claim 1, wherein
   three-dimensional information is constructed by integrating coordinate information on each position of a plurality of edges of a plurality of patterns formed on the inclined plane.

4. A pattern measurement device comprising:
   one or more processors configured to execute program instructions configured to cause the one or more processors to:
   generate an image of an area including a first pattern and a second pattern by using a charged particle beam device, the area being a first inclined plane formed by irradiating an ion beam to a sample area including at least the first pattern and the second pattern different from the first pattern;
   extract edges of the first pattern and the second pattern included in the image;
   calculate at least one of x coordinate information and y coordinate information of the extracted edges;
   receive angle information on the first inclined plane; and
   calculate z coordinate information on each position of the edge of the second pattern on the basis of any one of the x coordinate information and the y coordinate information on each position of the edge of the second pattern, the angle information on the inclined plane, and pitch information on the first pattern and the second pattern.

5. The pattern measurement device according to claim 4, wherein the program instructions are configured to cause the one or more processors to:
   obtain x coordinate information and y coordinate information on each position of an edge of a third pattern formed on the second inclined plane from a detection signal obtained by scanning the charged particle beam to a second inclined plane formed at a position different from a position of the first inclined plane, and
   obtain z coordinate information on each position of the edge of the third pattern on the basis of any one of the x coordinate information and the y coordinate information on each position of the edge of the third pattern and angle information on the second inclined plane.

6. The pattern measurement device according to claim 4, wherein the program instructions are configured to cause the one or more processors to construct three-dimensional information by integrating coordinate information on each position of a plurality of edges of a plurality of patterns formed on the inclined plane.

7. A pattern measurement method that measures a pattern constituting a circuit element having a deep hole, a deep groove, or a three-dimensional structure formed in a sample on the basis of a detection signal obtained by a scanning electron microscope, the method comprising steps of:

forming an inclined plane in a sample area including the circuit element having the deep hole, the deep groove, or the three-dimensional structure by a focused ion beam;

setting a field of view of the scanning electron microscope to include a boundary between the inclined plane and a surface of the sample and acquiring an image of the field of view on the basis of the detection signal obtained by scanning an electron beam to the field of view;

specifying a first reference point serving as a boundary between the inclined plane and a non-inclined plane by using the acquired image;

specifying a second reference point in order to specify a position of a desired deep hole or deep groove positioned in the inclined plane, a bottom of the deep hole or the deep groove, or a position of a pattern having the three-dimensional structure; and obtaining a dimension in a height direction of a pattern constituting the circuit element having the deep hole, the deep groove, or the three-dimensional structure on the basis of a dimension in the sample surface direction between the first position and the second position and an angle of the inclined plane;

wherein a plurality of contour lines are measured from a plurality of work surfaces and tomography measurement is performed by integrating the contour lines with each other.

8. The pattern measurement method according to claim 7, wherein the plurality of work surfaces are continuously formed and are measured to perform tomography measurement.

* * * * *